US009526075B2

(12) United States Patent
Terry

(10) Patent No.: US 9,526,075 B2
(45) Date of Patent: Dec. 20, 2016

(54) SYSTEM, A DEVICE AND A METHOD FOR ADJUSTING SIGNAL STRENGTH IN A DISTRIBUTED AMPLIFIER SYSTEM

(71) Applicant: Zone Access Technologies, Inc., Duluth, GA (US)

(72) Inventor: Scott Terry, Pleasanton, CA (US)

(73) Assignee: WHOOP WIRELESS LLC, Fort Lauderdale, FL (US)

( * ) Notice: Subject to any disclaimer, the term of this patent is extended or adjusted under 35 U.S.C. 154(b) by 144 days.

(21) Appl. No.: 14/149,830

(22) Filed: Jan. 8, 2014

(65) Prior Publication Data

US 2014/0192911 A1      Jul. 10, 2014

Related U.S. Application Data

(60) Provisional application No. 61/749,922, filed on Jan. 8, 2013.

(51) Int. Cl.
*H04W 16/26* (2009.01)
*H04W 24/02* (2009.01)
(Continued)

(52) U.S. Cl.
CPC .............. *H04W 52/245* (2013.01); *H03G 3/20* (2013.01); *H04B 1/16* (2013.01); *H04W 16/26* (2013.01);
(Continued)

(58) Field of Classification Search
CPC .. H04W 16/26; H04W 72/042; H04W 88/085; H04W 24/02; H04W 24/08; H04W 24/00; H04W 52/40; H04W 84/045; H04W 84/12; H04W 84/047; H04W 88/08; H04W 52/16; H04W 52/248; H04W 72/1226; H04B 7/14; H04B 7/15507; H04B 7/15535
(Continued)

(56) References Cited

U.S. PATENT DOCUMENTS 5,752,164 A      5/1998   Jones
5,873,048 A  *   2/1999   Yun ........................ G01S 3/325
                                                            342/359

(Continued)

FOREIGN PATENT DOCUMENTS

CN        102438255 A     12/2011
CN        101842995 B      6/2013
(Continued)

*Primary Examiner* — Philip Sobutka
(74) *Attorney, Agent, or Firm* — Perkins Coie LLP

(57) ABSTRACT

The invention discloses a system comprising a first device and a plurality of second device. The system comprises a first device and a plurality of second devices. The first device comprises a receiver, a spectrum analyzer, a controller and a transmitter. The receiver receives, from at least one antenna, a plurality of signals with different signal strengths from different sources. The spectrum analyzer is communicatively coupled to the receiver and obtains strengths of the plurality of received signals. The controller is communicatively coupled to the spectrum analyzer and adjusts a radiation feature of one of at least one antenna to minimize a difference of the strengths between a plurality of received signals after adjustment. The transmitter transmits the received signals after adjustment to a plurality of second devices distributed within a site. The plurality of second devices transmit the plurality of received signals after adjustment within the site.

1 Claim, 6 Drawing Sheets

(51) Int. Cl.
   *H04W 52/24* (2009.01)
   *H04W 24/08* (2009.01)
   *H03G 3/20* (2006.01)
   *H04B 1/16* (2006.01)
   *H04W 24/10* (2009.01)
   *H04W 52/52* (2009.01)
   *H04W 88/08* (2009.01)

(52) U.S. Cl.
   CPC ............. *H04W 24/02* (2013.01); *H04W 24/08* (2013.01); *H04W 24/10* (2013.01); *H04W 52/52* (2013.01); *H04W 88/085* (2013.01)

(58) Field of Classification Search
   USPC ..................... 455/3.01–3.06, 7, 15–17, 19
   See application file for complete search history.

(56) References Cited

U.S. PATENT DOCUMENTS

| | | | |
|---|---|---|---|
| 6,349,200 | B1 | 2/2002 | Sabat, Jr. et al. |
| 7,009,573 | B2 | 3/2006 | Hornsby et al. |
| 7,082,320 | B2 | 7/2006 | Kattukaran et al. |
| 7,764,924 | B1 | 7/2010 | Smithey et al. |
| 7,787,900 | B1 | 8/2010 | Raissinia et al. |
| 8,085,869 | B2 | 12/2011 | Behzad |
| 8,219,074 | B2 | 7/2012 | Lindgren et al. |
| 8,254,848 | B1 | 8/2012 | Elliott et al. |
| 8,284,713 | B2 | 10/2012 | Asati et al. |
| 8,442,515 | B2 | 5/2013 | Stump et al. |
| 8,532,492 | B2 | 9/2013 | Palanisamy et al. |
| 8,532,580 | B2 | 9/2013 | Elliott et al. |
| 8,619,847 | B1 * | 12/2013 | Anvari ................ H04L 27/2624 330/149 |
| 2006/0019604 | A1 * | 1/2006 | Hasarchi .................. H04B 1/71 455/15 |
| 2006/0084379 | A1 * | 4/2006 | O'Neill .............. H04B 7/15535 455/25 |
| 2007/0099667 | A1 * | 5/2007 | Graham ................. H01Q 1/007 455/562.1 |
| 2008/0174502 | A1 | 7/2008 | Oren et al. |
| 2011/0150050 | A1 | 6/2011 | Trigui et al. |
| 2012/0287978 | A1 | 11/2012 | O'Keeffe et al. |
| 2013/0109420 | A1 | 5/2013 | Nilsson et al. |
| 2013/0237158 | A1 | 9/2013 | Moe et al. |

FOREIGN PATENT DOCUMENTS

| | | |
|---|---|---|
| CN | 103384385 A | 11/2013 |
| EP | 0196098 B1 | 5/1992 |
| EP | 0442259 B1 | 7/1994 |
| EP | 0750405 A2 | 12/1996 |
| EP | 1071160 A2 | 1/2001 |
| EP | 2159933 A1 | 8/2008 |
| EP | 2159933 A1 | 3/2010 |
| EP | 2533433 A2 | 12/2012 |
| EP | 2587677 A1 | 5/2013 |
| WO | 9428690 A1 | 12/1994 |
| WO | 9900906 A2 | 1/1999 |
| WO | 2007044595 A2 | 4/2007 |
| WO | 2009155602 A1 | 12/2009 |
| WO | 2010124297 A1 | 10/2010 |
| WO | 2012024345 A2 | 8/2011 |
| WO | 2011156465 A1 | 12/2011 |
| WO | 2012138769 A1 | 10/2012 |

* cited by examiner

SYSTEM, A DEVICE AND A METHOD FOR ADJUSTING SIGNAL STRENGTH IN A DISTRIBUTED AMPLIFIER SYSTEM

CROSS-REFERENCE TO RELATED APPLICATION(S)

The present application claims the benefit of and incorporates by reference U.S. provisional application No. 61/749,922, entitled "Intelligent Distributed Amplifier System," which was filed on Jan. 8, 2013.

TECHNICAL FIELD

The present disclosure relates to a telecommunication system, and more particularly, but not exclusively to a system, a device and a method for adjusting signal strength in a distributed amplifier system.

BACKGROUND

In conventional telecommunication systems, an antenna will be aimed simply to get the strongest signal. However, in a distributed amplifier system (DAS), the system is designed to operate across all relevant radio frequency (RF) bands and therefore support all network operators in a particular market. To be specific, cellular signals from outdoor cellular towers may not provide clear and consistent coverage inside buildings, so wireless operators and building owners use DAS to broadcast cellular signals throughout their sites. Accordingly, there may be a plurality of antenna that transmit signals from different network operators to different users in the DAS system. Therefore, adjusting for different signal strengths may need to be improved.

SUMMARY OF THE INVENTION

In an embodiment, a system comprises a first device and a plurality of second device. The system comprises a first device and a plurality of second devices. The first device comprises a receiver, a spectrum analyzer, a controller and a transmitter. The receiver receives, from at least one antenna, a plurality of signals with different signal strengths from different sources. The spectrum analyzer is communicatively coupled to the receiver and obtains strengths of the plurality of received signals. The controller is communicatively coupled to the spectrum analyzer and adjusts a radiation feature of one of at least one antenna to minimize a difference of the strengths between a plurality of received signals after adjustment. The transmitter transmits the received signals after adjustment to a plurality of second devices distributed within a site. The plurality of second devices transmit the plurality of received signals after adjustment within the site.

In another embodiment, a device comprises a receiver, a spectrum analyzer and a controller. The receiver receives, from at least one antenna, a plurality of signals with different signal strengths from different sources. The spectrum analyzer is communicatively coupled to the first receiver and determines whether the strengths of the plurality of received signals are within a predetermined range. The controller is communicatively coupled to the first spectrum analyzer and adjusts a radiation feature of some or all of at least one antenna such that the strengths of the plurality of received signals are within the predetermined range.

In another embodiment, a device comprises a receiver, a spectrum analyzer, controller and a filter. The receiver receives, from at least one antenna communicatively coupled to the device, a plurality of signals with different signal strengths from different sources. The spectrum analyzer is communicatively coupled to the receiver and obtains strengths of the plurality of received signals are within a predetermined range. The controller is communicatively coupled to the spectrum analyzer and determines an adjustment indication according to the strength. The device further comprises a filter configured to adjust some or all of the gain of at least one of the strengths of the plurality of received signals according the adjustment indication such that the strengths of the plurality of received signals after adjustment are within the predetermined range.

In another embodiment, a method comprises receiving, from at least one antenna, a plurality of signals with different signal strengths from different sources; determining whether the strengths of the plurality of received signals are within a predetermined range; and adjusting gain of some or all of at least one of the strengths of the plurality of received signals such that the strengths of the plurality of received signals after adjustment are within the predetermined range.

BRIEF DESCRIPTION OF THE DRAWINGS

The present invention is illustrated in an exemplary manner by the accompanying drawings. The drawings should be understood as exemplary rather than limiting, as the scope of the invention is defined by the claims. In the drawings, like references indicate similar elements.

DETAILED DESCRIPTION

Figure 1A:
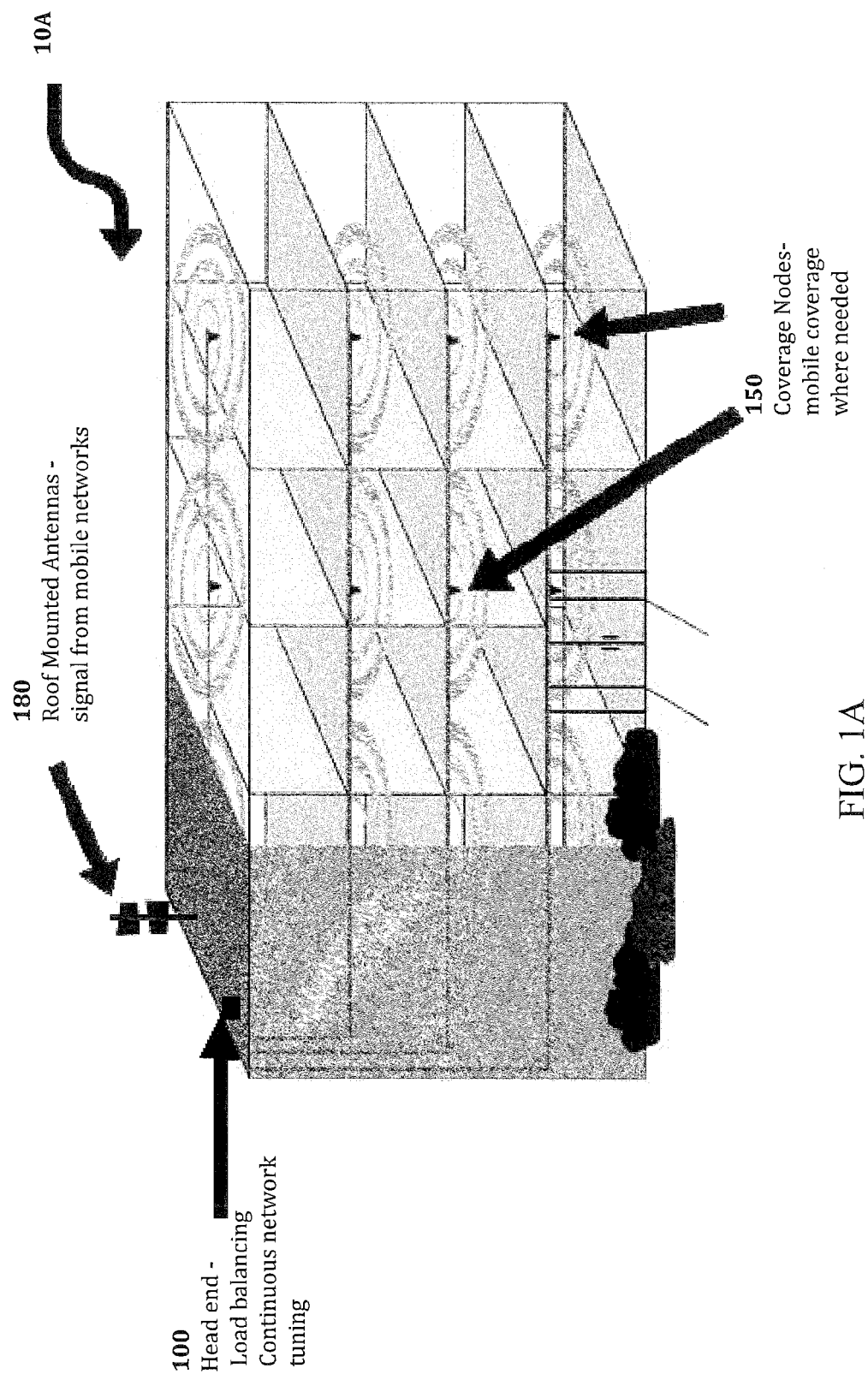
FIG. 1A is a diagram illustrating a deployment of a distributed amplifier system.

FIG. 1A is a diagram illustrating a deployment of a distributed amplifier system 10A. The cellular signals from outdoor cellular towers may not provide clear and consistent coverage inside buildings, so wireless operators and building owners use distributed antenna systems 10A to broadcast cellular signals throughout their sites. Note that the cellular signals are for illustration, and it may also include Wi-Fi signals, satellite signals, and other communication signals. The communications signals are distributed throughout building interiors, campus environments, and outdoor areas using an active Distributed Amplifier System (DAS). The DAS is active because it uses signal amplifiers to add gain to communications radio frequency (RF) signals. This gain also facilitates penetration of the signals throughout a building, campus environment, or outdoor areas despite physical obstructions such as walls, interior structures, poles, and trees without loss of signal integrity.

The distributed amplifier system 10A comprises a head end 100, a plurality of coverage nodes 150 and roof mounted antenna(s) 180. The distributed amplifier systems 10A work by distributing wireless signals throughout an interior space: the signal is typically brought to the building using roof-mounted antennas 180 or with a base station (BTS) installed in a telecommunications equipment room. The antennas 180 or BTS is then connected to the DAS using coaxial cabling or other wired or wireless connection mechanism. The DAS network of coverage nodes 150 is placed strategically throughout the building using cable or other connection mechanism. The DAS works with multiple coverage nodes 150 strategically placed within the building to provide reliable text messaging, data, and voice communications. All coverage nodes 150 in the system may be networked together to deliver a balanced and reliable signal throughout the site. The head end unit 100 manages all of the coverage nodes 150 in the DAS system along with local and remote access for monitoring and status checking. Alternatively, management may be distributed across the network.

Alternatively, the DAS system can be installed in any site, which may include tunnels, fields, sports stadiums, subway or railway stations, buses, airports, or subways, etc. in addition to the building shown in FIG. 1A.

Figure 1B:
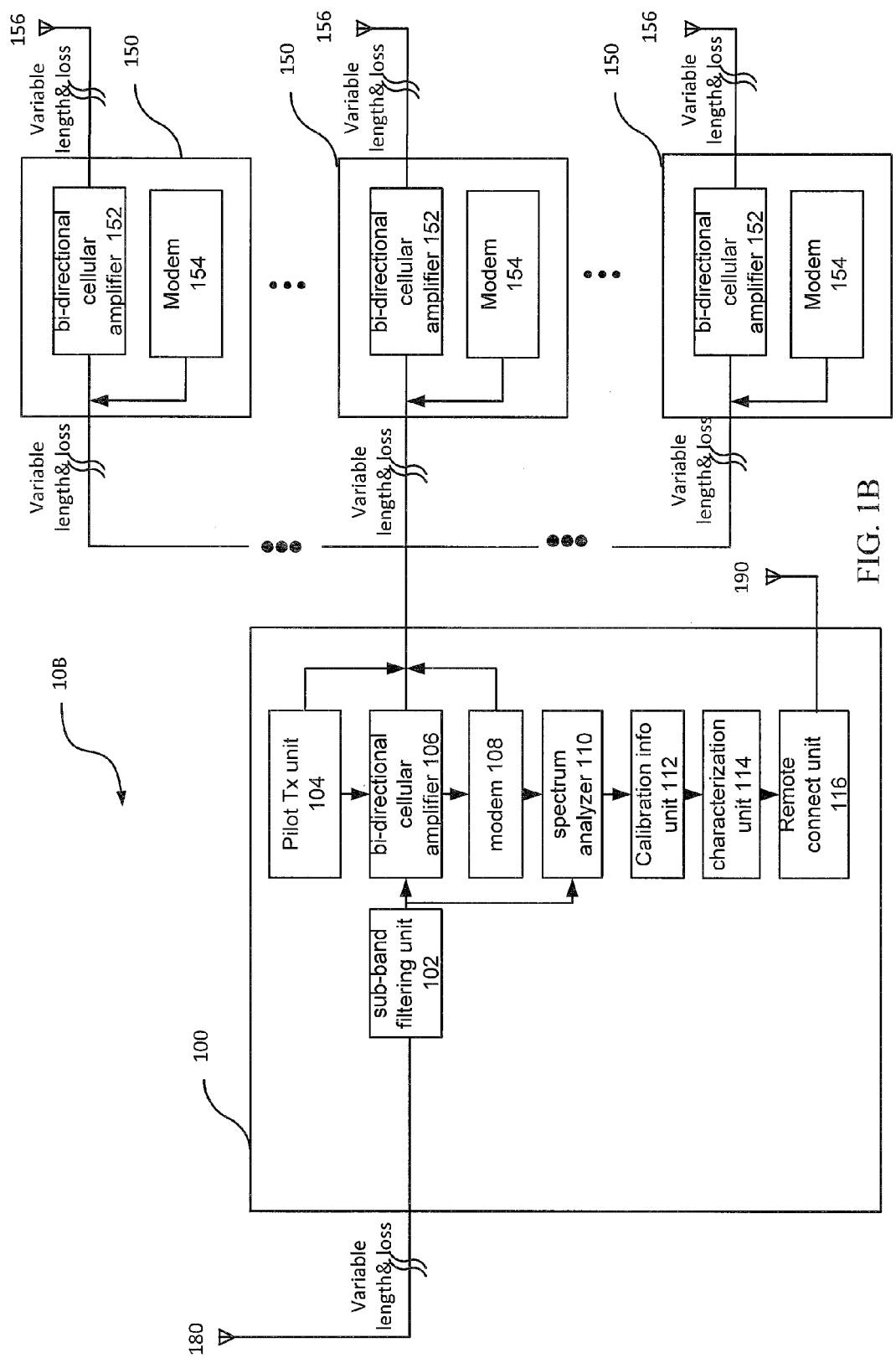
FIG. 1B is a block diagram illustrating a different embodiment of the distributed amplifier system.

FIG. 1B is a block diagram illustrating a detailed embodiment 10B of the distributed amplifier system 10A shown in FIG. 1A. A distributed amplifier system 10B shown in FIG. 1B comprises a head end 100 and a plurality of coverage nodes 150. The head end 100 comprises a sub-band filtering unit 102, a Pilot Tx (Transmit) unit 104, a bi-directional cellular amplifier 106, a modem 108, a spectrum analyzer 110, a calibration info unit 112, a characterization unit 114, and a remote connect unit 116.

The sub-band filtering unit 102 is communicatively coupled to the antenna 180 and filters sub-band signals. The bi-directional cellular amplifier 106 is communicatively coupled to the sub-band filtering unit 102 and amplifies the filtered sub-band signals. The bi-directional cellular amplifier 106 is also communicatively coupled to the pilot Tx unit 104, so that the bi-directional cellular amplifier 106 can obtain information regarding how close the coverage antennas 156 are to each other from the pilot Tx unit 104. The bi-directional cellular amplifier 106 is further communicatively coupled to the modem 108, so that the filtered signals are delivered to the modem 108. The modem 108 is part of an internal network for access and control of the DAS. To be more specific, the modem 108 is a communication device that talks to all of the remote nodes including but not limited to modems 154. The spectrum analyzer 110 is communicatively coupled to the sub-band filtering unit 102 and analyzes spectrum of the signals outputted by the filter 102. The calibration information unit 112 is communicatively coupled to the spectrum analyzer 110 and collects calibration information from the spectrum analyzer 110. The calibration info unit 112 is the place where all of the calibration information for all nodes and the head end are stored. This calibration information is used by the characterization unit 114 to determine if the environment has changed. The characterization unit 114 is communicatively connected to the calibration information unit 112 and observes the way the unit is calibrated and then monitors the entire DAS system to determine if the environment is ever change thus requiring recalibration. The characterization unit 114 can be used to trigger trouble shooting in the system. The remote connect unit 116 is communicatively connected to the characterization unit 114 and transmits remote connect information through the antenna 190 or via other wired or wireless connection mechanism. The Pilot Tx unit 104 is a Pilot transmitter, and is used to measure how close the coverage antennas are to each other. The term "communicative couple" includes any kinds of couple, such as wired or wireless connection. The term "communicatively couple" includes any kinds of coupling, such as wired or wireless connection.

While only one amplifier 106 is shown in the first device 100, in an embodiment of the invention, there are multiple amplifiers to amplify different frequencies. Further, while the amplifier 106 is referred to as a cellular amplifier, it can also amplify other signals, such as WiFi, WiMax, public emergency signals etc. Similarly, while only one amplifier 152 is shown in the second device 150, in an embodiment of the invention, there are multiple amplifiers to amplify different frequencies. Further, while the amplifier 152 is referred to as a cellular amplifier, it can also amplify other signals, such as WiFi, WiMax, public emergency signals etc. Further, the amplifier may also be a single direction amplifier, such as uplink or downlink.

While only one sub-band limiting unit 102 is shown in the first device 100, in an embodiment of the invention, there are multiple sub-band limiting units 102 to filter signals in different sub-bands.

Each of the coverage node 150 comprises a bi-directional cellular amplifier 152 and a modem 154. The bi-directional cellular amplifier 152 is communicatively coupled to the modem 154. The uplink and downlink signals are amplified by the bi-directional cellular amplifier 152. Each of the cellular amplifier is also communicatively coupled to an antenna 156 to transmit downlink signals to user equipment (UE) attached to or covered by the coverage nodes 150, or receive uplink signals from the user equipment attached to or covered by the coverage nodes 150. The head end 100 and each of the coverage nodes 150 are connected by coaxial cable or other connection mechanism.

Each of the various modules shown in FIG. 1B (e.g., Calibration info unit 112) can be implemented in pure hardware (e.g., specially-designed dedicated circuitry such as one or more application-specific integrated circuits (ASICs)), or in programmable circuitry appropriately programmed with software and/or firmware, or in a combination of pure hardware and programmable circuitry.

Figure 2:
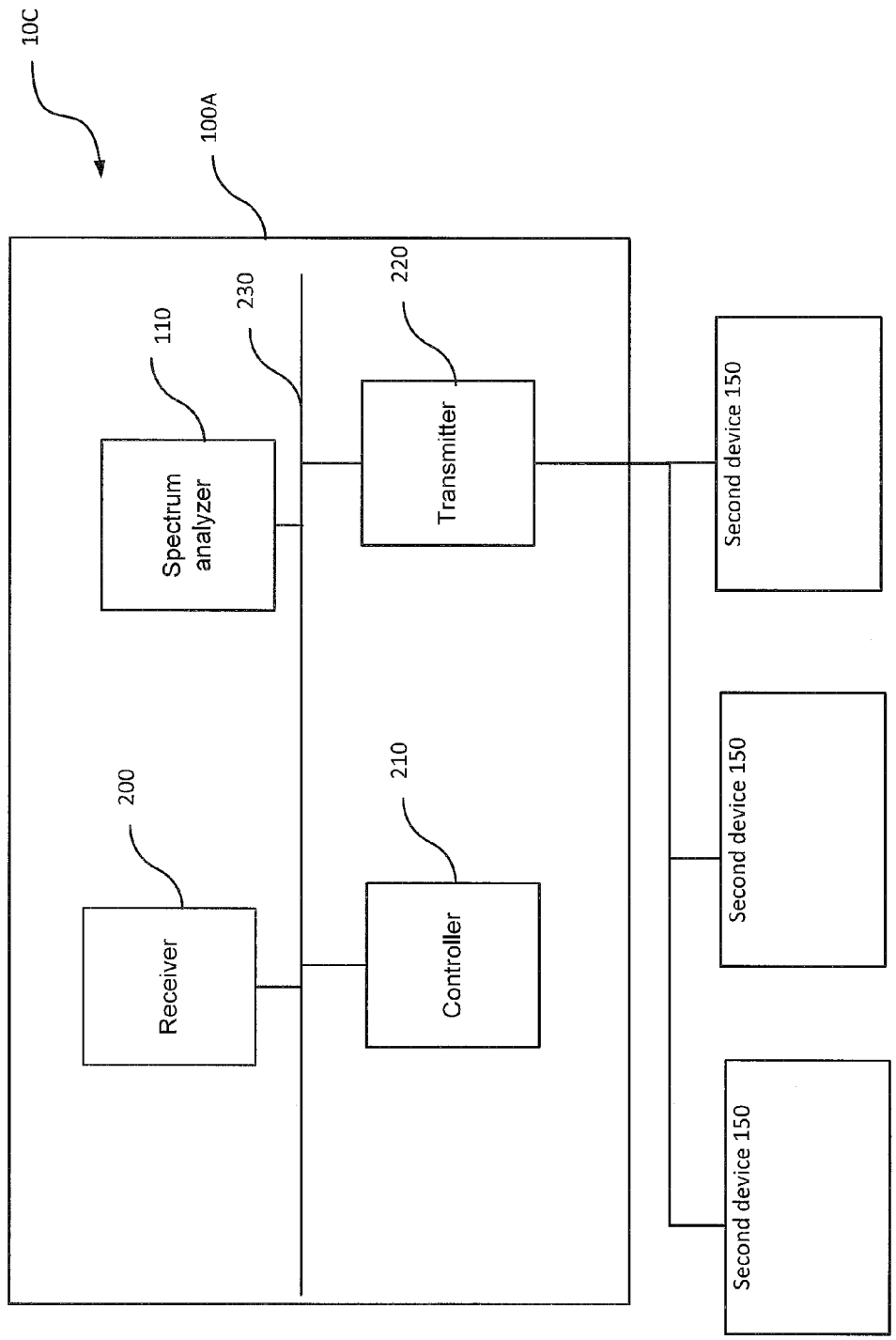
FIG. 2 is a diagram illustrating a block diagram of a different embodiment of the distributed amplifier system.

FIG. 2 is a block diagram illustrating a different embodiment 10C of the distributed amplifier system 10A shown in FIG. 1A. The distributed amplifier system 10C, also a simplified version of the system 10B shown in FIG. 1B, shows the units or modules pertinent to the embodiment. The system 10C comprises a first device 100A and a plurality of second devices 150. The first device 100A comprises a receiver 200, a spectrum analyzer 110, a controller 210 and a transmitter 220. The first device 100A may be implemented by the head end 100 shown in FIGS. 1A and 1B. The second devices 150 shown in FIG. 2 are substantially the same as the second devices 150 shown in FIGS. 1A and 1B. The interconnect 230 shown in FIG. 2 is an abstraction that represents any one or more separate physical buses, point-to-point connections, wired or wireless connections. The interconnect 230, therefore, may include, for example, a system bus, a form of Peripheral Component Interconnect (PCI) bus, a HyperTransport or industry standard architecture (ISA) bus, a small computer system interface (SCSI) bus, a universal serial bus (USB), IIC (I2C) bus, a CAN-bus (Controller Area Network), or an Institute of Electrical and Electronics Engineers (IEEE) standard 1394 bus, also called "Firewire", and/or any other suitable form of physical or virtual connection, either wired or wireless.

The receiver 200 receives, from at least one antenna, a plurality of signals with different signal strengths from different sources. The antenna may include the roof mounted antenna 180 shown in FIG. 1A. The antenna receives signals from at least one source, such as an outdoor cellular tower, a Base Transceiver Station (BTS), or a small cell. The antenna may be used on rooftops, and are generally directional antennas. The plurality of signals may be from different operators, such as 3G signals from AT&T and 3G signals from T-Mobile. Alternatively, the plurality of signals may be from same operator and with different format, such as both 3G signals and Wi-Fi signals from AT&T. Alternatively, the plurality of signals may be from same or different operator(s) and with different frequencies, such as a signal with a frequency of 1900 MHz, and a signal with a frequency of 850 MHz.

The spectrum analyzer 110 is communicatively coupled to the receiver 200. The spectrum analyzer 110 determines whether the strengths of the plurality of received signals are within a predetermined range. The predetermined range may be from −60 dBm to −40 dBm. The spectrum analyzer 110 looks at all of the signals across the band to help determine what antenna position will result in the flattest signal on all frequencies.

The controller 210 is communicatively coupled to the spectrum analyzer 110. The controller 210 adjusts a radiation feature of some or all of at least one antenna such that the strengths of a plurality of the received signals after adjustment are within the predetermined range. When using the antenna to flatten the RF signals across the band, the controller 210 may have constant feedback of the RF signal while the antenna positions are changing. The spectrum analyzer 110 supports real time feedback to the controller 210 and the controller 210 suggests an ideal antenna position based on measured data. For example, the controller controls the antenna 180 to aim away from the close tower and/or direct at the far away tower, so that the signals would be more balanced across the band.

As a result of the adjustment, the signal strengths for all frequencies across each band (850 MHz cell band, 1900 MHz PCS band, etc.) are near the same level across the band. If the antenna is aimed away from the close tower and/or directly at the far away tower, the signals would be more balanced across the band.

The transmitter 220 transmits the received signals after adjustment to a plurality of second devices 150 distributed within a building. Those having ordinary skill in the art can understand that although we only show three second devices 150, in practical application, there may be more or less than three second devices deployed in the system 10C. The plurality of second devices 150 transmit the plurality of received signals after adjustment within the building.

Alternatively, the spectrum analyzer 110 obtains both a maximum strength and a minimum strength of the plurality of received signals. The controller 210 adjusts the radiation feature of an antenna with the maximum strength and the radiation feature of an antenna with the minimum strength, such that the strengths of the plurality of received signals after adjustment are within the predetermined range. The adjustment may be based on the difference between the highest and lowest valid signals across the band. Note that the antenna with the maximum strength and the antenna with the minimum strength may be same or different.

Alternatively, the plurality of signals spread across a plurality of frequency bands. The frequency bands may include but is not limited to 850 MHz cell band, 1900 MHz PCS band, cellular, public emergency, Wi-Fi, wireless broadband (e.g., LTE, WiMAX), and other wireless bands used as part of public, private, global, cloud, mesh, and other networks. The spectrum analyzer 110 obtains both a maximum strength and a minimum strength of each frequency band. The controller 210 adjusts the radiation feature of some or all of at least one antenna, such that the strengths of the plurality of received signals in each of the plurality of frequency bands are within the predetermined range. According to the embodiment, the antenna is aimed by looking at all signals across each band and the optimal setting is determined to balance signals.

For example, with cellular communication system RF bands, the frequencies are divided into sub-bands with distinct cellular network operators using one or more of these sub-bands. Each of these network operators may utilize its own network towers in different locations, having different signal strengths. Alternatively, network operators may share network towers but still have different signal strength due to different equipment used by each operator. As such, RF signals that reach a location may contain significantly different signal strength from one network operator to the next. In such a scenario, the controller adjusts radiation feature of antenna across all bands and of all the network operators, so as to ensure that the strengths of the plurality of received signals across the plurality of frequency bands are within the predetermined range.

The radiation feature of at least one antenna comprises directions of at least one antenna. Alternatively, the radiation feature of at least one antenna comprises locations of at least one antenna. In an embodiment, the direction and/or location of the antenna is adjusted so that the strengths of a plurality of received signals after adjustment are within the predetermined range. The predetermined range may be 70 dBm for example. Generally speaking, a signal received from a close tower has stronger strength than the signal received from a distant tower. The antenna may be aimed away from the close tower and/or directed at the distant tower, so that the signals would be more balanced across the band.

The predetermined range can be adjusted based on specific application scenario by those having ordinary skill in the art.

The first device 100A includes the head end. The second devices 150 include the coverage nodes 150. The head end and the coverage nodes may be wired connected. In other words, the wireless signals received and conditioned by the head end are transported throughout the building to a network of the coverage nodes.

With an embodiment of the invention, different signal strengths that are captured by the antenna will be adjusted to be flat, in other words, within a same range. As a result, the weaker signals will be adjusted to be of similar magnitude to the strongest signals, and the difference between the signals with maximum strength and the signals with minimum strength are reduced after adjustment.

Figure 3:
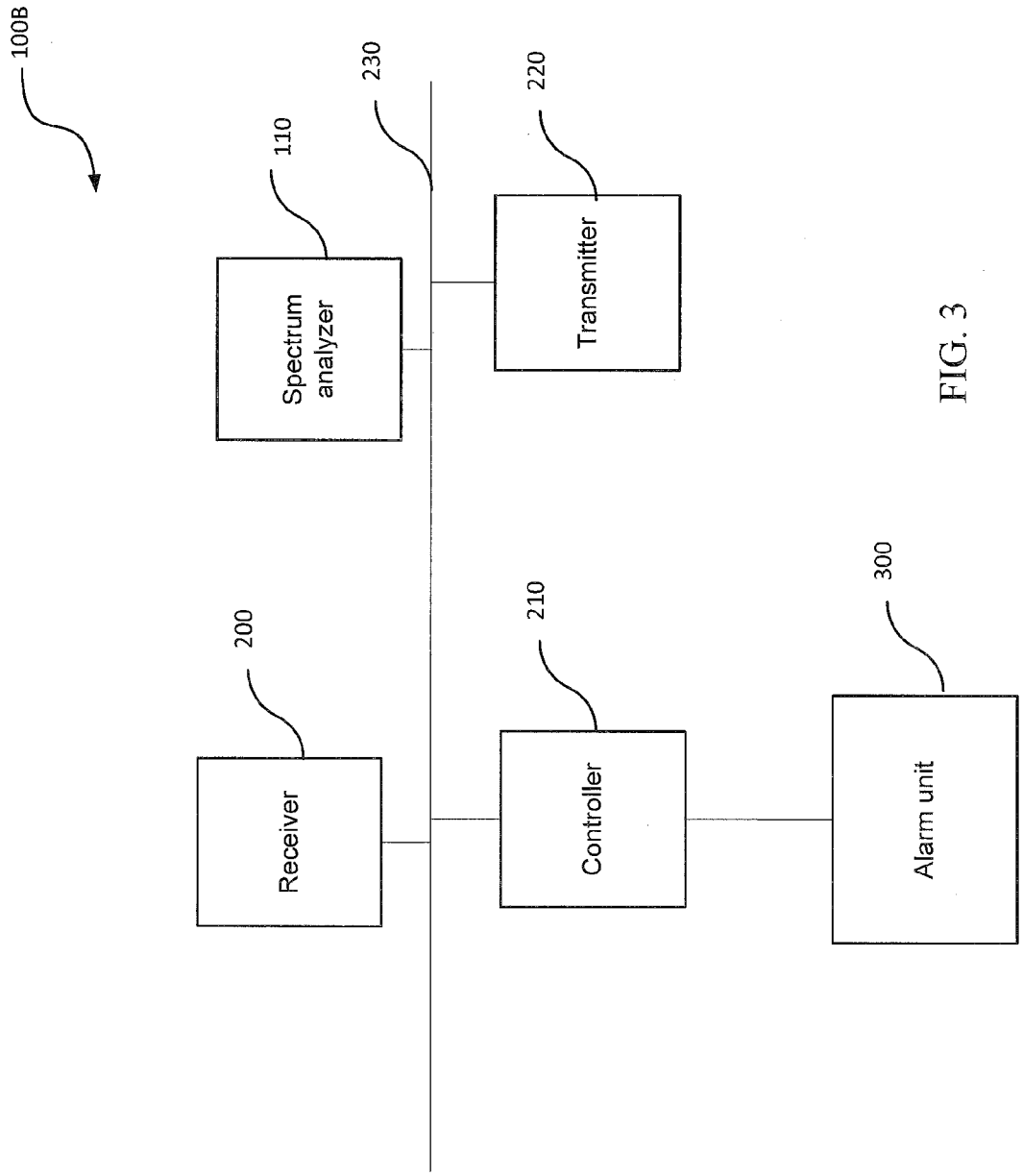
FIG. 3 is a block diagram illustrating a different embodiment of a first device.

FIG. 3 is a block diagram illustrating a different embodiment 100B of the first device 100 shown in FIG. 1B. In other words, the first device 100B may be implemented by the head end 100 shown in FIGS. 1A and 1B. Details are omitted for elements already described with respect to FIG. 2. In addition to the receiver 200, the spectrum analyzer 110 and the controller 210 which are described with respect to FIG. 2, the first device 100B further comprises an alarm unit 300. The alarm unit 300 is communicatively coupled to the spectrum analyzer 110. The alarm unit 300 generates an alarm signal if the spectrum analyzer 110 detects that a change of the strengths of the plurality of received signals exceed a predetermined threshold. For example, the predetermined threshold may be 10 dBm. If a change in strength of a received signal exceeds the 10 dBm threshold, for example, when the change in strength of the maximum received signal exceeds 10 dBm, or the change in strength of the minimum received signal exceeds 10 dBm, then the alarm unit 130 triggers an alarm signal.

After an installation of the DAS is completed, the RF environment may change significantly. These changes can result from reconfiguration of the source communication system, or from a change in the surroundings of the DAS equipment. This change could affect the RF signal strengths across the band and result in the DAS not operating optimally. The DAS will monitor the signal flatness and determine if conditions have changed. If the conditions have changed sufficiently, an alarm will trigger instructing a site visit by a service person, who will re-aim the antennas or effect similar adjustments. Alternatively, if the antenna has automatic directing function, the trigger can directly instruct the directional control unit 102 to adjust the antenna. Communication signals may not be distributed properly since the communications systems (for example, cellular, Wi-Fi, public safety, or other wireless networks) can change over time, and since the possibility of equipment failure within the DAS exists.

Remote monitoring is used allowing the review and control of all system equipment and components. A remote access is performed via several mediums, including but not limited to TCP over cellular or Wi-Fi. The DAS supports internal communication to all amplifiers and active devices in the system; and the remote connection is only needed to connect to one piece of equipment in the DAS to allow communications to all components of the system. Once a remote connection is made, a set of self-monitoring alarms are enabled in the DAS, which trigger the DAS to actively contact the assigned entity or monitoring station with an issue or alarm condition. By monitoring the system internally, the DAS will notify the system management team or other interested party when it is not operating effectively.

One method of detecting problems in the system is to characterize the system after it is initially installed and periodically afterwards. This characterization includes the levels of the communication network operators' source signals throughout the DAS and at the point of each antenna, and the calibration results of the system when measuring the RF losses throughout the DAS and also includes measuring the antenna feedback results. The DAS will then self-monitor this characterization and trigger an alarm if the characterization has changed. In addition, when a user of the DAS issues a complaint that the system is not working, remote monitoring will allow access to the DAS to run the characterization check and verify proper operation.

Remote monitoring works for more than just examining the DAS after installation. The installation itself will benefit substantially from remote monitoring. Since DAS installations often involve third party installation operators, the level of DAS knowledge of the installers is often lacking. This can lead to problems with the installations and increase cost significantly due to repeated visits to the site to correct common problems. Instead, the remote monitoring is used during the installation to allow experts in DAS installation to examine each step of the installation to ensure proper set-up and optimization of the system.

Figure 4:
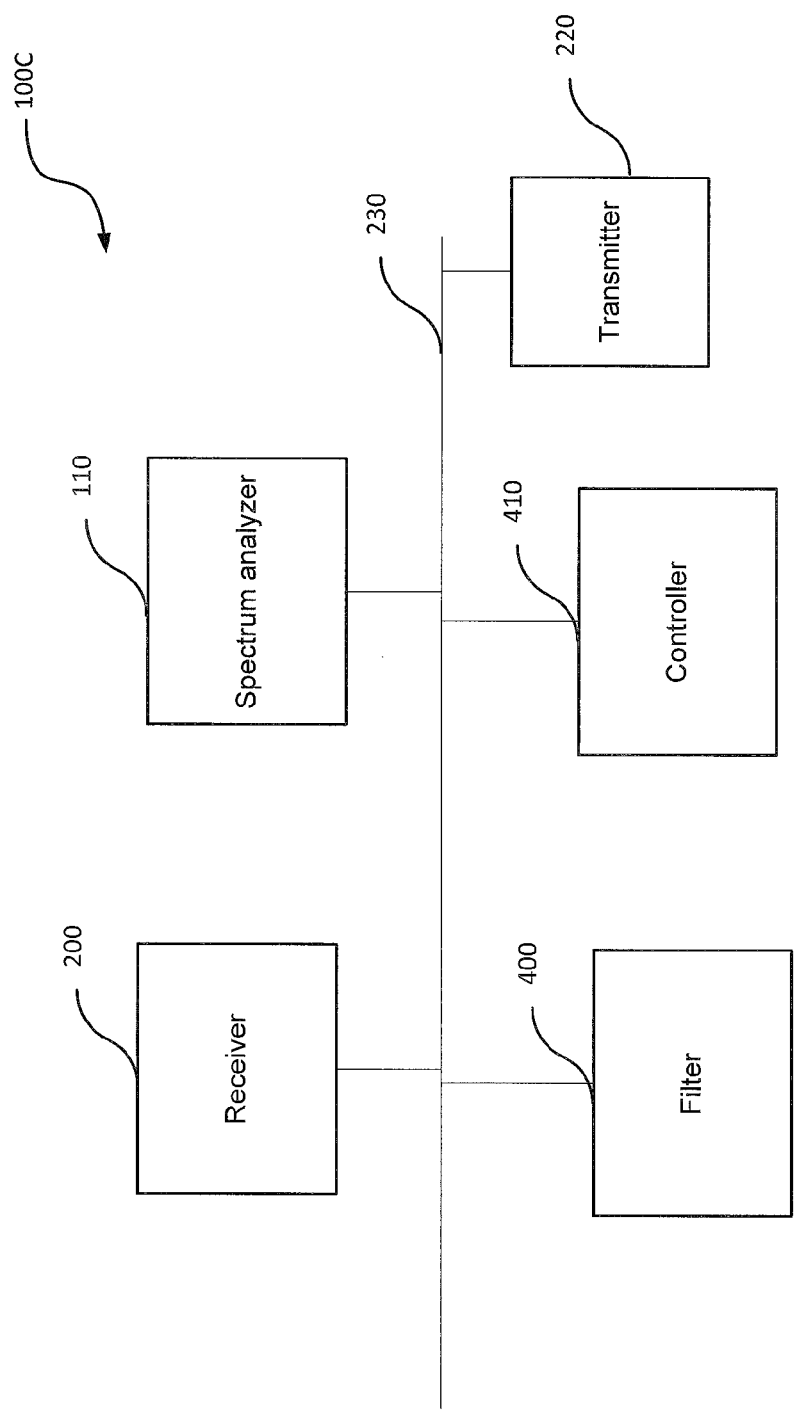
FIG. 4 is a block diagram illustrating another embodiment of a first device.

FIG. 4 is a block diagram illustrating a different embodiment 100C of the first device 100 shown in FIG. 1B. The first device 100C may be implemented by the head end 100 shown in FIGS. 1A and 1B. The device 100C comprises a receiver 200, a spectrum analyzer 110, a controller 410 and a filter 400. The receiver 200 receives, from at least one antenna communicatively coupled to the device, a plurality of signals with different signal strengths from different sources. The spectrum analyzer 110 is communicatively coupled to the receiver 200, and determines whether the strengths of the plurality of received signals are within a predetermined range. The predetermined range may be from −60 dBm to −40 dBm. The controller 410 is communicatively coupled to the spectrum analyzer 110 and determines an adjustment indication according to the strength. The filter 400 is communicatively coupled to the controller 410 and adjusts some or all of the gain of at least one of the strengths of the plurality of received signals such that the strengths of the plurality of received signals after adjustment are within the predetermined range. The interconnect 230 shown in FIG. 4 is substantially the same as the interconnect 230 shown in FIG. 2, which represents the interconnection among the receiver 200, the spectrum analyzer 110, the filter 400, the controller 410 and the transmitter 220.

In another embodiment, the receiver 200, the controller 410, the filter 400, the spectrum analyzer 110, and the transmitter 220 are connected in serial. The filter 400 may change the signal to make it more flat, and the output of this filter 400 may feed into the transmitter 220 and the spectrum analyzer 110. In other words, the filter 400 will alter what the spectrum analyzer 110 and the transmitter 220 will get.

Further, the filter 400 may include RF tuning circuits that can vary the RF gain in certain portions of the band.

The filter 400 may include a radio frequency (RF) filter configured to adjust gain of some or all of the at least one of the strengths of the plurality of received signals such that the strengths of the plurality of received signals after adjustment are within the predetermined range. For example, the filter 400 may reduce the peak levels as much as possible, and increase the lowest levels as much as possible.

Alternatively, the filter 400 may include a synthesizer configured to select a part of the plurality of received signals within a predetermined frequency range. Note that as some portions of the band may be unused, so it would be left out of the determination. The unused portion may be, for example, portions of the spectrum may not be built out with equipment from the licensed operator. This happens frequently in rural areas. Therefore, the synthesizer only picks part of the plurality of received signals.

Alternatively, the filter 400 may comprise a digital signal processing (DSP) unit configured to filter the plurality of signals.

Figure 5:
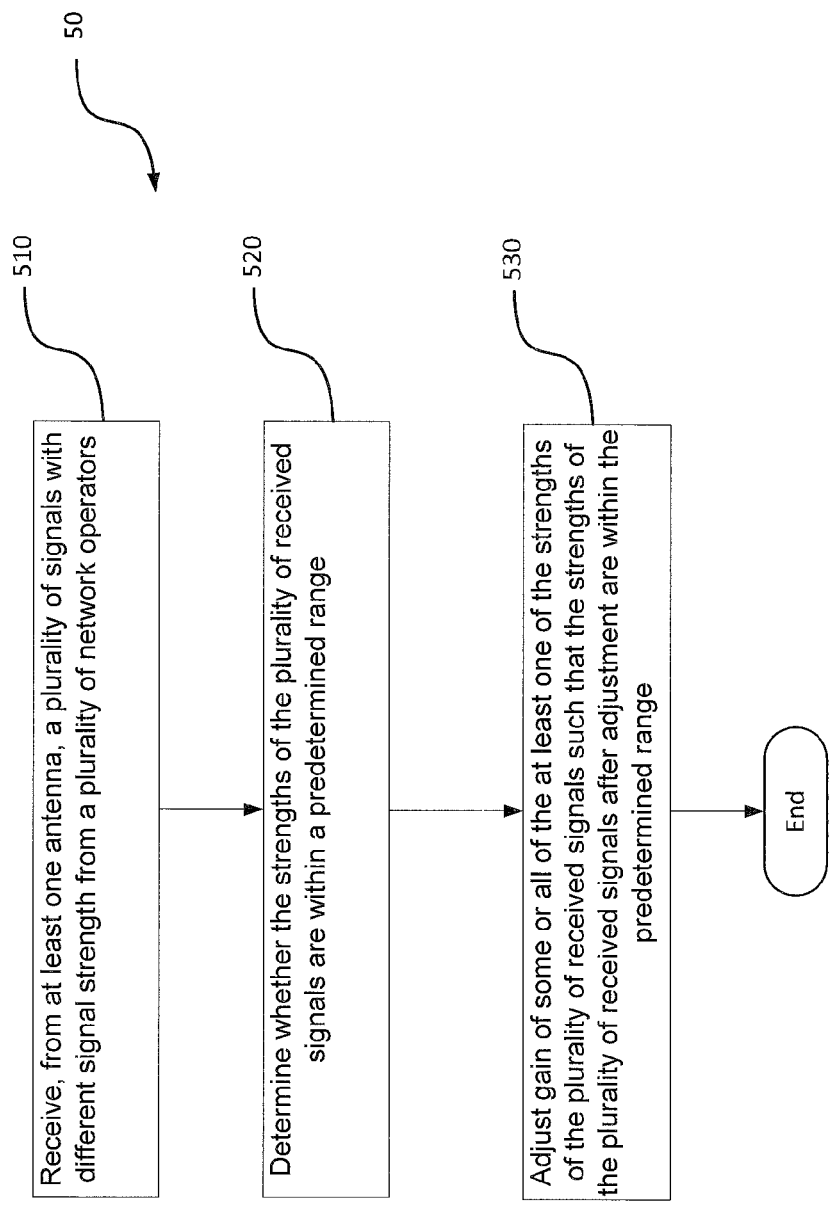
FIG. 5 is a flow chart illustrating an embodiment of a method.

FIG. 5 is a flow chart illustrating an embodiment of a method 50. The method 50 may be implemented by the head end 100 shown in any of the prior figures. The method 50 comprises receiving (in block 510), from at least one antenna, a plurality of signals with different signal strengths from different sources; determining (in block 520) whether the strengths of the plurality of received signals are within a predetermined range; and adjusting (in block 530) gain of some or all of at least one of the strengths of the plurality of received signals such that the strengths of the plurality of received signals after adjustment are within the predetermined range.

The method 50 adjusts the signal based on the highest and lowest valid signals in each band to be as close together as possible. In other words, the difference of the strengths of the plurality of signals after adjustment are within a predetermined scope. The scope may be as small as possible, which may be 20 dBm for example. The method 50 may minimize the difference between the high and low signals; as a result, the circuit would be adjusted to provide the best performance possible.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The adjusting (530) may include any of the methods mentioned previously herein.

From the foregoing, it will be appreciated that specific embodiments of the invention have been described herein for purposes of illustration, but that various modifications may be made without deviating from the scope of the invention. Accordingly, the invention is not limited except as by the appended claims.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Even if certain features are recited in different dependent claims, the present invention also relates to an embodiment comprising these features in common. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

I claim:

1. A system comprising:
   a first device comprising
      a receiver configured to receive, from at least one antenna, a plurality of signals with different signal strengths from different sources;
      a spectrum analyzer communicatively coupled to the receiver and configured to obtain strengths of the plurality of received signals;
      a controller communicatively coupled to the spectrum analyzer and configured to adjust a radiation feature of one of at least one antenna to minimize a difference of the strengths between a plurality of received signals after adjustment, the radiation feature including location of at least one antenna; and
      a transmitter configured to transmit the received signals after adjustment to a plurality of second devices distributed within a site; and
   the plurality of second devices configured to transmit the plurality of received signals after adjustment within the site.

* * * * *